United States Patent
Gardner et al.

[19]

[11] Patent Number: 6,011,290
[45] Date of Patent: Jan. 4, 2000

[54] SHORT CHANNEL LENGTH MOSFET TRANSISTOR

[75] Inventors: Mark I. Gardner, Cedar Creek; H. Jim Fulford, Austin, both of Tex.

[73] Assignee: Advanced Micro Devices, Sunnyvale, Calif.

[21] Appl. No.: 09/009,787

[22] Filed: Jan. 20, 1998

[51] Int. Cl.[7] .................................................. H01L 27/088
[52] U.S. Cl. ...................... 257/345; 257/384; 257/401; 257/409; 257/487
[58] Field of Search ....................... 257/327, 337, 257/368, 390, 344, 408, 409, 412, 384, 336, 401, 345, 487

[56] References Cited

U.S. PATENT DOCUMENTS

| | | | |
|---|---|---|---|
| 5,162,884 | 11/1992 | Liou et al. | 257/384 |
| 5,434,440 | 7/1995 | Yoshimoto et al. | 257/344 |
| 5,554,871 | 9/1996 | Yamashita et al. | 257/336 |
| 5,610,430 | 3/1997 | Yamashita et al. | 257/412 |
| 5,631,485 | 5/1997 | Wei et al. | 257/344 |
| 5,658,815 | 8/1997 | Lee et al. | 438/304 |

*Primary Examiner*—Donald L. Monin, Jr.

[57] ABSTRACT

A semiconductor device is formed from a semiconductor substrate with a source and drain and a gate disposed thereon. The gate has a stepped profile with side portions with respective walls adjacent a respective one of the source and drain. The side portions of the gate are thinner than that of a center portion of the gate. The substrate is implanted with nitrogen forming first regions below the side portions of the gate and adjacent the surface of the substrate. The source and drain are implanted with nitrogen in second regions adjacent the side portions of the gate and spaced away from the surface of the substrate. The substrate is doped so that regions of the substrate lying above the second regions and to the side of the first regions are heavily doped, wherein the first and second regions implanted with nitrogen resist the doping.

20 Claims, 3 Drawing Sheets

SHORT CHANNEL LENGTH MOSFET TRANSISTOR

FIELD OF THE INVENTION

The present invention relates generally to integrated circuit manufacturing and more particularly to forming insulated gate field effect transistors.

BACKGROUND OF THE INVENTION

An insulated-gate field-effect transistor (JGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. Currently, the gate oxide is formed having a substantially uniform thickness. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device dimension reduction comes from several interests. One is the desire to increase the number of individual IGFETs that can be placed onto a single silicon chip or die. More IGFETs on a single chip leads to increased functionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduced the length of the conduction channel underneath the gate and dielectric layer regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. Several methods have been used in the past to form a graded doping region. One common technique for use with a typical gate having a gate oxide with a uniform thickness, is the formation of a graded doping in both the source region and the drain region. The most common way to form a graded doping region is to form a lightly doped region in the drain with a first ion implant using the sidewalls of a gate as a self-aligning mask. Spacers are then formed on the sidewalls of the gate and a second implant of dopant is made. In other words, the drain is typically formed by two ion implants. The first light implant is self-aligned to the gate, and a second heavy implant is self-aligned to the gate on which sidewall spacers have been formed. The spacers are typically oxides or nitrides. The part of the drain underneath the spacers is more lightly doped than the portion of the drain not shielded by the spacers. This more lightly doped region is referred to as a lightly doped drain (LDD).

The LDD reduces hot carrier effects by reducing the maximum lateral electric field. The purpose of the lighter first dose is to form a lightly doped region of the drain (or Ldd) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

As shown above, a threshold point exist where heightened speed and reduced dimensions will lead to IGFET breakdown. Conventional approaches have encountered difficulty trying to reconcile the methods for decreasing the hot carrier effects and the methods for improving performance. Also, it is desirable to improve these sought after results without adding costly processing steps. Thus, it is an objective to uncover newly configured IGFET structures and the methods to produce the same which will increase performance while not compromising the IGFET's longevity or fabrication costs.

Graded-drain regions can be created in IGFETs in a number of ways, including: (1) using phosphorus in place of As as the dopant of the source/drain regions; (2) adding fast diffusing phosphorus to an As-doped drain region, and driving the phosphorus laterally ahead of the arsenic with a high temperature diffusion step to create a double-diffused drain [DDD] structure; and (c) pulling the highly doped ($n^+$) drain region away from the gate edge with an "oxide spacer" to create a lightly doped drain (LDD) structure. Each of these methods requires a number of processing steps. Most require two implant steps to form a lightly doped region and a heavily doped region. A method is needed which reduces the number of implant processing steps.

SUMMARY OF THE INVENTION

According to one embodiment of the invention, there is provided a semiconductor device and a method for forming the same. A semiconductor substrate is provided with a source and drain formed therein and a gate disposed thereon, the gate having at least one side portion with a wall adjacent one of the source or drain, the side portion being thinner than that of another portion of the gate. Nitrogen is implanted into the substrate into at least one first region below the side portion of the gate and adjacent the surface of the substrate, and into at least one second region within the source or drain adjacent the at least one side portion, the second region being spaced away from the surface of the substrate. The substrate is doped so that a region of the substrate lying above the second region and to the side of the first region is heavily doped, wherein the first and second regions implanted with nitrogen resist the doping. The gate may be formed with a side portion by first forming a gate of substantially uniform thickness and then removing a portion of the gate to form the thinner side portion. Nitrogen may be implanted in the substrate through the thinner side portion of the gate, wherein the thicker portion of the gate acts as a mask to prevent nitrogen implantation. Advantageously, a heavily doped region may be formed adjacent the gate while minimizing the doping under the gate.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
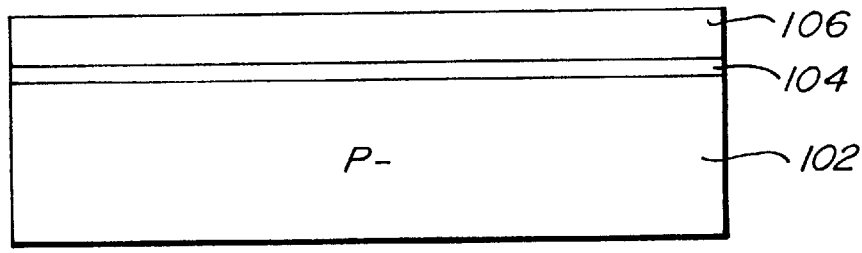
FIGS. 1A–1F show cross-sectional views of successive process steps for making an IGFET having a uniform gate oxide layer and graded doping in the drain region and source region.

An NMOSFET is described to show the most common method for forming a transistor device with a graded source and drain. In FIG. 1A, silicon substrate 102 suitable for integrated circuit manufacture includes P-type epitaxial layer with a boron background concentration on the order of $1 \times 10^{16}$ atoms/cm$^3$, a <100> orientation and a resistivity of 12 ohm-cm. Preferably, the epitaxial surface layer is disposed on a P+ base layer (not shown) and includes a planar top surface. Gate oxide 104, composed of silicon dioxide (SiO$_2$), is formed on the top surface of substrate 102 using oxide tube growth at a temperature of 700° to 1000° C. in an O$_2$ containing ambient. A typical oxidation tube contains several sets of electronically powered heating coils surrounding the tube, which is either quartz, silicon carbide, or silicon. In O$_2$ gas oxidation, the wafers are placed in the tube in a quartz "boat" or "elephant" and the gas flow is directed across the wafer surfaces to the opposite or exhaust end of the tube. A gate oxide 104 having a uniform thickness is formed.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 106 be doped during an implantation step following a subsequent etch step.

Figure 1B:
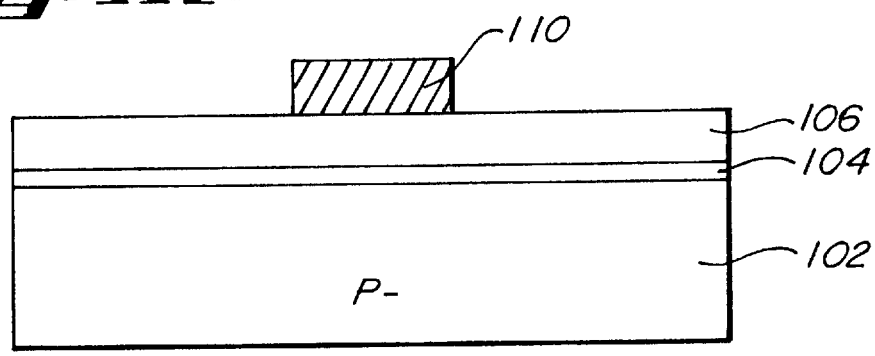

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticule and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
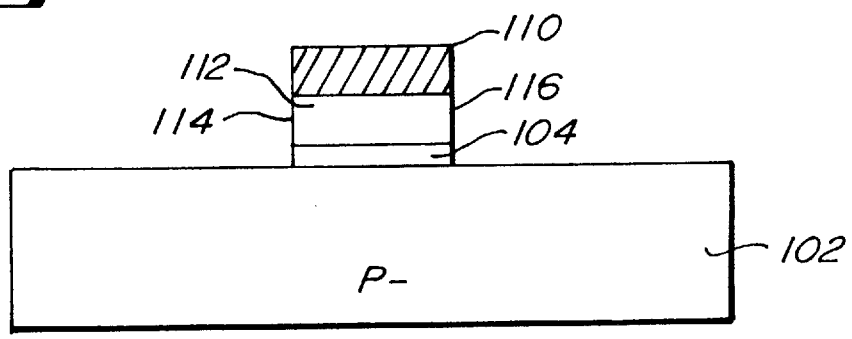

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is left on the surface of the silicon substrate 102 and has a thickness in the range of 30–60 angstroms. Typically, the gate oxide 104 is placed on the surface of the silicon substrate 102 at the selected thickness in the range of 30–60 angstroms. Although unlikely, a second dry or plasma etch may be applied that is highly selective of silicon dioxide (the typical gate material), using the remaining photoresist 110 as an etch mask to thin the layer of the gate oxide 104 to a selected thickness. After the etching step or steps, a gate oxide layer of 30–60 angstroms remains atop the surface of the silicon substrate, and the remaining portion of the polysilicon 106 provides polysilicon gate 112 with opposing vertical sidewalls 114 and 116. Polysilicon gate 112 has a length (between sidewalls 114 and 116) of 3500 angstroms.

Figure 1D:
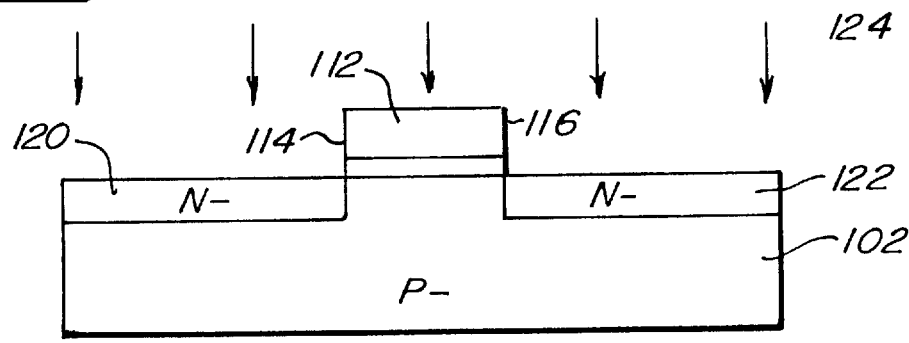

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of The ion implantation of phosphorus is done through the layer of gate oxide 104. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N—with a phosphorus concentration in the range of about $1 \times 10^{17}$ to $5 \times 10^{18}$ atoms/cm$^3$.

Figure 1E:
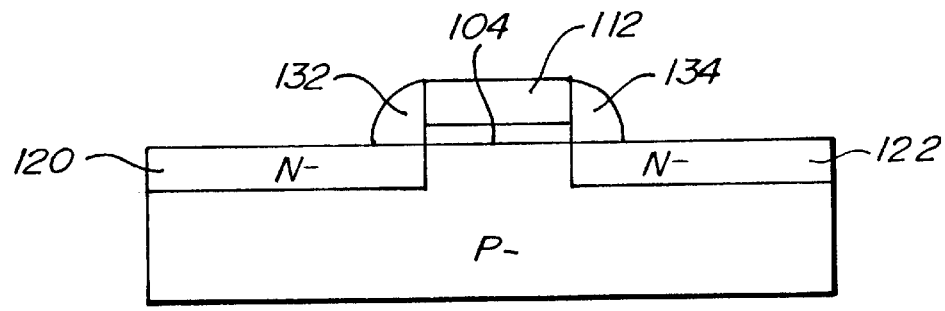

As shown in FIG. 1E, spacers 132 and 134 are formed. A blanket layer of silicon dioxide with a thickness of approximately 2500 angstroms is conformably deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend approximately 1200 angstroms across substrate 102.

Figure 1F:
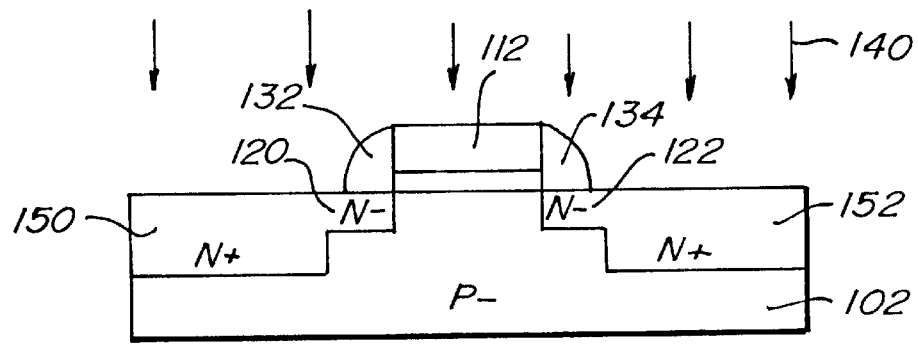

In FIG. 1F, the portions of the lightly doped source region 120 and the lightly doped drain region 122 outside oxide spacers 132 and 134 are converted into heavily doped source region 150 and heavily doped drain region 152 by subjecting the structure to ion implantation of arsenic, indicated by arrows 140, at a dose in the range of $2 \times 10^{15}$ to $3 \times 10^{15}$ atoms/cm$^2$ and an energy in the range of 20 to 80 kiloelectron-volts. Polysilicon gate 112 and oxide spacers 132 and 134 provide an implant mask for the underlying portion of substrate 102. As a result, the heavily doped source region 150 and heavily doped drain region 152 are substantially aligned with the oxide spacer 132 on the side opposite sidewall 114, and the oxide spacer 134 on the side opposite sidewall 116. A rapid thermal anneal on the order of 900° to 1050° C. for 10 to 30 seconds is applied to remove crystalline damage and to drive-in and activate the implanted dopants. As a result, heavily doped source region 150 and the lightly doped source region 120 merge to form a source with graded doping. Similarly, heavily doped source region 152 and the lightly doped source region 122 merge to form a drain with graded doping.

Figure 2A:
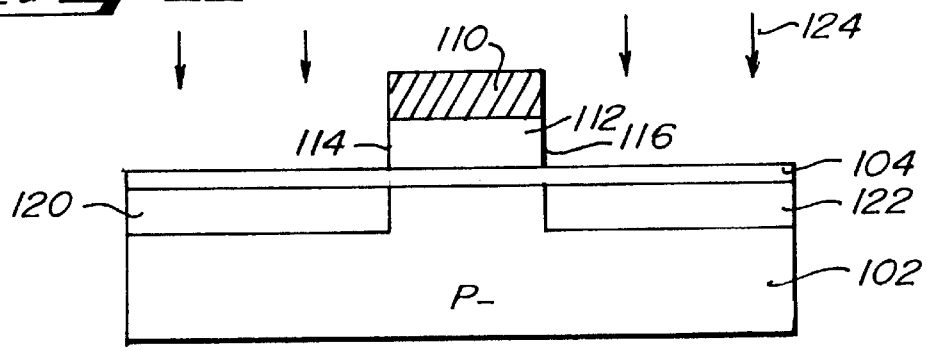
FIGS. 2A–2D show cross-sectional views of successive process steps for making an IGFET with a short channel length in accordance with an embodiment of the invention.

FIGS. 2A–2D illustrate a method for forming a MOSFET transistor with an short channel length. The structure shown in FIG. 2A may be obtained using the process steps described above with respect to FIGS. 1A and 1B. In FIG. 2A, lightly doped source and drain regions 120 and 122 are implanted into substrate 102 by subjecting the structure to ion implantation of boron, indicated by arrows 124, at a dose in the range of $5 \times 10^{14}$–$5 \times 10^{15}$ atoms/cm$^2$ and an energy in the range of 5 to 50 kiloelectron-volts. The ion implantation is done through the layer of gate oxide 104. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped P—with a boron concentration in the range of about $1 \times 10^{17}$–$1 \times 10^{19}$ atoms/cm$^3$.

Figure 2B:
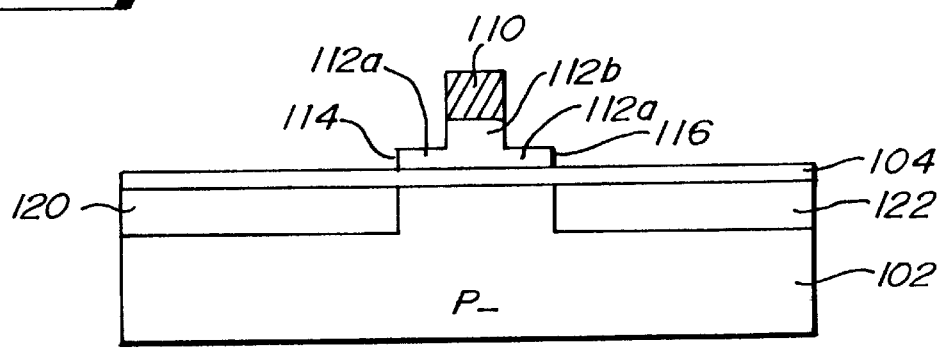

As shown in FIG. 2B, photoresist 110 and polysilicon gate 116 are trimmed and etched to form a polysilicon gate 116 having a base with side portions 112a and a center portion 112b extending upwardly from the base.

Figure 2C:
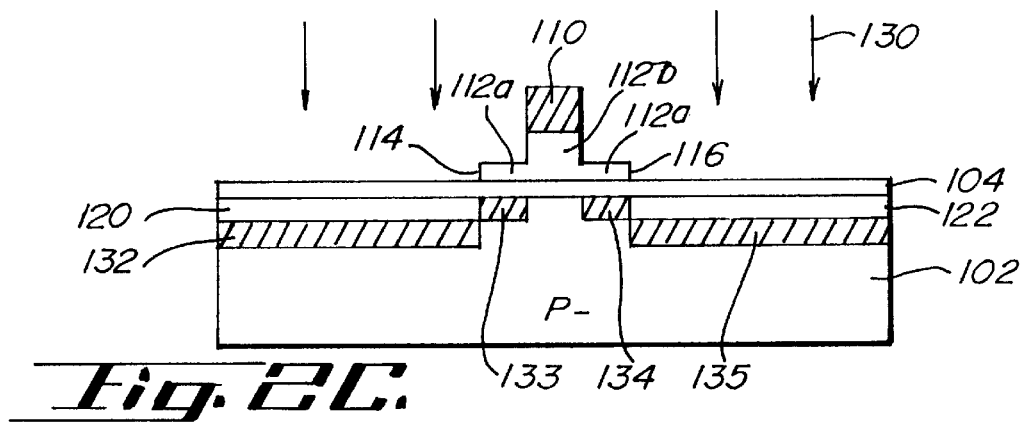

As shown in FIG. 2C, a nitrogen implant, represented by arrows 130, is formed in regions 132–135 of the substrate. The nitrogen implant in regions 133 and 134 is formed adjacent the surface of substrate 102. The nitrogen implant in regions 132 and 135 is driven deeper into the substrate than regions 133 and 134 as a result of the partial masking provided by the polysilicon side portions 112a of the gate.

Figure 2D:
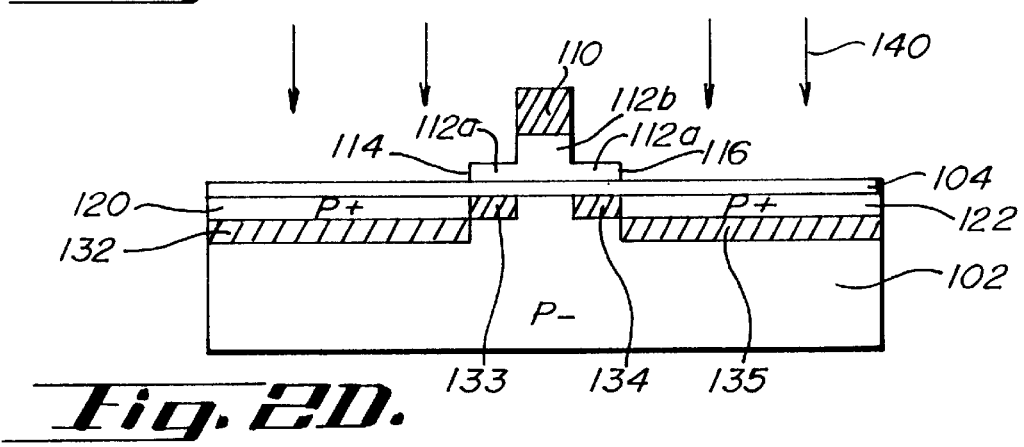

As shown in FIG. 2D, a P+ implant is applied to the resulting structure, providing heavily doped source and drain regions in the area of the substrate above regions 132 and 135. The nitrogen implant in regions 132–135 resists the P+ doping. Thus, there are provided a heavily doped P+ source and drain areas that are adjacent the sidewalls 114 and 116 of the side portions 112a of the base of the gate 112.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gate 112, on the top of the source 120 and on the top of the drain 122. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. Suitable N-type dopants include arsenic, phosphorus and combinations thereof. Alternatively, if a P-channel device is desired, suitable P-type dopants include boron, boron species (such as boron difluoride) and combinations thereof.

Figure 3:
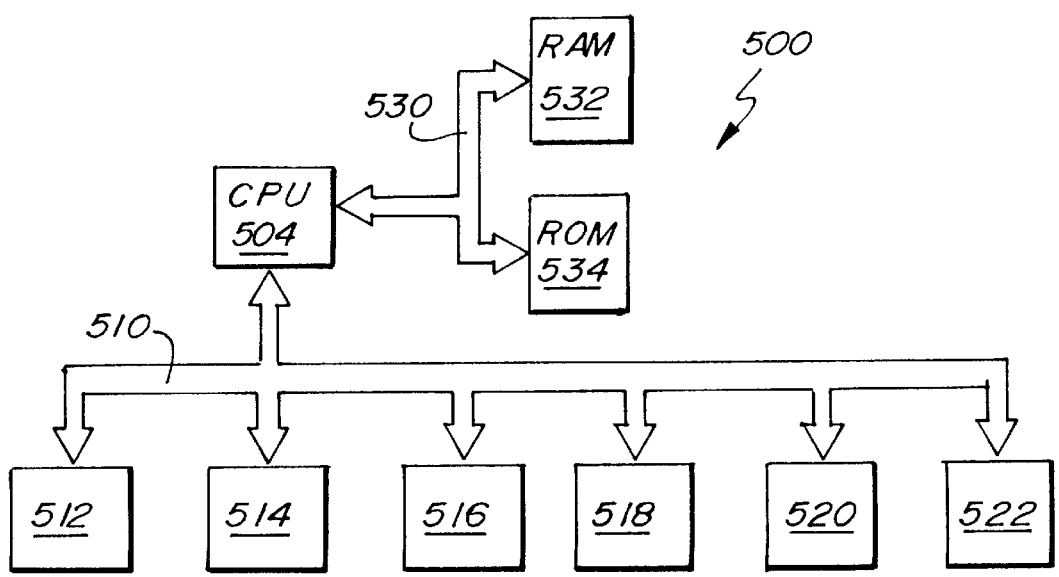
FIG. 3 is a schematic of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system 500 includes a central processing unit 504, a random access memory 532, and a system bus 530 for communicatively coupling the central processing unit 504 and the random access memory 532 ROM 534. The information handling system 500 includes a device formed by the steps shown in FIG. 2A–2I, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The information handling system 500 includes a device such as is described above with respect to FIGS. 2A–2D. The channel formed as in the steps shown in FIGS. 2A–2D and the resulting device provides for a fast and reliable channel having a long life. Faster channels are needed as clocking speeds for microprocessors climb and the channel must also be reliable and long-lived. The drain regions can be formed in one ion implant step rather than several. The length of the channel is also controllable since the spacers can also be controlled.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A semiconductor device comprising:
   a semiconductor substrate with a source and drain formed therein and a gate disposed thereon, the gate comprising a center portion, and a base portion, said base portion having a side portion that extends outwardly from said center portion and has a wall adjacent one of the source and drain, the side portion being thinner than that of another portion of the gate;
   at least one first region below the side portion of the gate and adjacent the surface of the substrate having nitrogen implanted therein, and at least one second region within the source or drain adjacent the at least one side portion having nitrogen implanted therein, the second region being spaced away from the surface of the substrate; and
   a region of the substrate lying above the second region and to the side of the first region being heavily doped, and wherein the first and second regions implanted with nitrogen are not heavily doped.

2. The device of claim 1 further wherein the gate is formed of polysilicon.

3. The device of claim 2 further wherein nitrogen is not implanted beneath the center portion of the gate.

4. The device of claim 1 further wherein the heavily doped regions are doped with P+.

5. The device of claim 4 further wherein the P+ is a boron dopant.

6. The device of claim 1 further wherein the base portion of said gate has a side portion on each side, each side portion extending outwardly from said center portion, and wherein each side portion is thinner than the center portion.

7. A semiconductor device, according to claim 6, wherein the center portion of the gate includes a top surface having a width that is narrower than a width of the base including the side portion.

8. A semiconductor device, according to claim 7, further including a salicide contact at the top surface of the gate.

9. A semiconductor device, according to claim 8, wherein said at least one first region includes a region under each side portion.

10. A semiconductor device, according to claim 9, further including a salicide contact at the top surface of the gate.

11. A semiconductor device, according to claim 1, wherein the center portion of the gate includes a top surface having a width that is narrower than a width of the base including the side portion.

12. A semiconductor device, according to claim 11, further including a salicide contact at the top surface of the gate.

13. An information handling system including a device comprising:

a semiconductor substrate with a source and drain formed therein and a gate disposed thereon, the gate comprising a center portion and a base portion, said base portion having a side portion that extends outwardly from said center portion and has a wall adjacent one of the source or drain, the side portion being thinner than that of another portion of the gate;

at least one first region below the side portion of the gate and adjacent the surface of the substrate having nitrogen implanted therein, and at least one second region within the source or drain adjacent the at least one side portion having nitrogen implanted therein, the second region being spaced away from the surface of the substrate; and a region of the substrate lying above the second region and to the side of the first region being heavily doped, and wherein the first and second regions implanted with nitrogen are not heavily doped.

14. The device of claim 13 further wherein the base portion of said gate has a side portion on each side, each side portion extending outwardly from said center portion, and wherein each side portion is thinner than the center portion.

15. The device of claim 14 further wherein nitrogen is not implanted beneath the center portion of the gate.

16. The device of claim 13 further wherein the gate is formed of polysilicon.

17. An information handling system, according to claim 13, wherein the center portion of the gate includes a top surface having a width that is narrower than a width of the base including the side portions.

18. An information handling system, according to claim 17, further including a salicide contact at the top surface of the gate.

19. An information handling system, according to claim 18, wherein said at least one first region includes a region under each side portion.

20. An information handling system, according to claim 19, wherein said at least one second regions includes a region within the source and another region with the drain.

* * * * *

UNITED STATES PATENT AND TRADEMARK OFFICE
CERTIFICATE OF CORRECTION

PATENT NO. : 6,011,290      PAGE 1 of 2

DATED : January 4, 2000

INVENTOR(S) : GARDNER et al.

It is certified that error appears in the above-identified patent and that said Letters Patent is hereby corrected as shown below:

Col. 1, line 9: "JGFET" should read --IGFET--.

Col. 2, line 29: "arc" should read --are--.

Col. 2, line 49: replace "(c)" with --(3)--.

In the Detailed Description of the Preferred Embodiment:

Col. 4, line 10: "reticule" should read --reticle--.

Col. 4, line 40: after "indicated by arrows 124" delete "at a dose in the range of".

Col. 4, line 47: "doped N— (dash)" should read --doped N-(minus)--.

Col. 5, line 28: "doped P—" should read --doped P- --.

Col. 6, line 21: "several devices peripheral devices" should read --several peripheral devices--.

UNITED STATES PATENT AND TRADEMARK OFFICE
CERTIFICATE OF CORRECTION

PATENT NO.   : 6,011,290
DATED        : Jan. 4, 2000
INVENTOR(S)  : Gardner et al Page 2 of 2

It is certified that error appears in the above-identified patent and that said Letters Patent is hereby corrected as shown below:

Col. 7, line 20: "according to claim 1" should read --According to claim 6--.

Signed and Sealed this

Third Day of April, 2001

Attest:

NICHOLAS P. GODICI

Attesting Officer

Acting Director of the United States Patent and Trademark Office